United States Patent [19]

Saunders et al.

[11] 3,731,218

[45] May 1, 1973

[54] ACTIVE DOUBLE TUNED BAND PASS FILTER

[75] Inventors: John Saunders, East Hartford; Clarence Casper, Jr., Windsor, both of Conn.

[73] Assignee: United Aircraft Corporation, East Hartford, Conn.

[22] Filed: Sept. 9, 1971

[21] Appl. No.: 178,960

[52] U.S. Cl. ..............................330/178, 333/80 R

[51] Int. Cl. ..............................H03f 1/00

[58] Field of Search ..............................330/107, 109, 178; 333/80 R, 80 T; 307/295; 328/167

[56] References Cited

UNITED STATES PATENTS 2,788,496 4/1957 Linvill ..............................330/80

OTHER PUBLICATIONS

Huelsman, "Use of Two Negative-Impedance Converters to Synthesize RC Transfer Functions," IRE Transactions on Circuit Theory, September 1961, P 357

Yanagisawa, "RC Active Networks Using Current Inversion Type Negative Impedance Converters," IRE Transactions on Circuit Theory September 1957 pp 140–144

*Primary Examiner*—Roy Lake
*Assistant Examiner*—James B. Mullins
*Attorney*—Melvin Pearson Williams

[57] ABSTRACT

A double tuned active band pass filter is formed by utilizing a pair of band pass filters including negative impedance converter (NIC) circuits coupled with a pi-type or T-type capacitive coupling network, the capacitances of which provide the output capacitance of the first stage in the input capacitance of the second stage and a coupling capacitor. The first stage and the coupling capacitor form essentially a current generator allowing current mode operation of the second stage. In one mode, the coupling capacitor is chosen to be roughly two orders of magnitude less than the capacitors in the leg of the pi, the capacitances of which are the natural capacitances of the individual filter stage. In another mode, the coupling capacitor is made to be somewhere on the order of magnitude of the capacitance of the original devices, and the legs of the pi are adjusted to be equal to the value of the coupling capacitor divided by one plus the decimal fraction that the coupling capacitance bears to the basic capacitance. In a T-type configuration, greater, rather than lesser capacitance is used.

5 Claims, 2 Drawing Figures

INVENTORS
JOHN SAUNDERS
CLARENCE CASPER, JR.
BY Melvin Pearson Williams
ATTORNEY

ACTIVE DOUBLE TUNED BAND PASS FILTER

BACKGROUND OF THE INVENTION

1. Field of Invention

This invention relates to active filters, and more particularly to low frequency active double tuned band pass filters.

2. Description of the Prior Art

There are numerous applications wherein the use of band pass filters at low frequencies (perhaps as low as 20 Hz) are required. In the past, such filters utilize large inductors to achieve the low frequency response. However, in modern avionics, the use of large inductors is prohibitive due to the size and weight thereof, so that it is desirous to use active filters of the type which essentially utilize inverted capacitive impedances to give the same response as inductive impedances.

An additional complication arises from the fact that the pass band of the filter generally must be limited so as to restrict the frequency components which will pass therethrough. For instance, if a full octave of bandwidth (the high pass limit being on the order of twice the frequency of the low pass limit) can be tolerated, then it is possible to utilize the series combination of a high pass filter and a low pass filter, with the breakpoint frequency of the high pass filter adjusted at the desired low breakpoint frequency of the band pass, and the breakpoint frequency of the low pass filter adjusted at the high frequency breakpoint of the band pass filter. However, when the band pass is reduced to something on the order of a third of an octave, then this technique is not possible, since the out-of-band attenuation of the high and low frequency attenuation skirts of the filter interfere with one another and severely limit the response of the device, rendering a flat frequency response characteristic with sharp skirts almost impossible.

As is known in filter technology, the desirable characteristics of a substantially flat response over a substantial portion of the band pass is not easily achieved due to the fact that the sharpness of the skirts require high Q (quality factor) of the filter, whereas the flatness of response generally requires a relatively low Q. To overcome this, it has been known to utilize a pair of band pass filters coupled in series with one another the result of which, if the coupling is significant, is to broaden the response (increasing the flatness) while maintaining the same attenuation factor at the skirts as that of each individual filter.

However, this has heretofore not been achieved in active filter networks implementable in solid state technology which can result in a flat response characteristic and sharp attenuation skirts.

SUMMARY OF INVENTION

The object of the present invention is to provide an improved active filter network capable of operating at low frequency with a narrow bandwidth having a flat characteristic with sharp attenuating skirts.

According to the present invention, a pair of active filter networks including negative impedance converter circuits are coupled with a pi-type or T-type capacitive coupling network, the capacitances of which provide coupling between the stages and the output and input capacitance for the first and second filter stages, respectively.

In further accord with the present invention, the shunt capacitance between the two filter sections is at least a fraction of an order of magnitude greater than the series capacitance thereof. In one embodiment, the individual capacitances are the same as the like capacitance in a single filter stage and an additional capacitance differs by at least two orders of magnitude. In another embodiment, the additional capacitance differs by within or nearly an order of magnitude, and the other capacitances are adjusted accordingly by some small amount.

In accordance further with the invention in one form, the second negative impedance converter circuit is operated in a current input mode rather than a voltage input mode, the input capacitance of which is thereby configured as one of the legs of the pi-type capacitive coupling network. In still further accord with this form of present invention, the capacitances of the pi-type coupling network are chosen with respect to the inherent capacitances of the negative impedance converter device at the desired frequency so as to be substantially less than an order of magnitude smaller, or, substantially the same order of magnitude with a related reduction in the size of the capacitors in the legs of the pi-type capacitive coupling network; in a T-type embodiment, greater rather than lesser capacitances are used.

The present invention eliminates the need for inductances, and provides the capability for a sub-octave band pass filter easily implemented at a variety of frequencies, including frequencies under 100 Hz. Filters in accordance with the present invention are readily implemented using solid logic technology, and avoid the necessity of large capacitances. In addition, the present invention has the advantage of adjustability of the frequency characteristic of the filter by simply adjusting the gain of the negative impedance converter circuits, without having to adjust the values of the fixed components (resistors, capacitors) which are chosen merely to establish the center frequency of the device.

The foregoing and other objects, features and advantages of the present invention will become more apparent in the light of the following detailed description of a preferred embodiment thereof, as illustrated in the accompanying drawing.

DESCRIPTION OF THE PREFERRED EMBODIMENT

Figure 1:
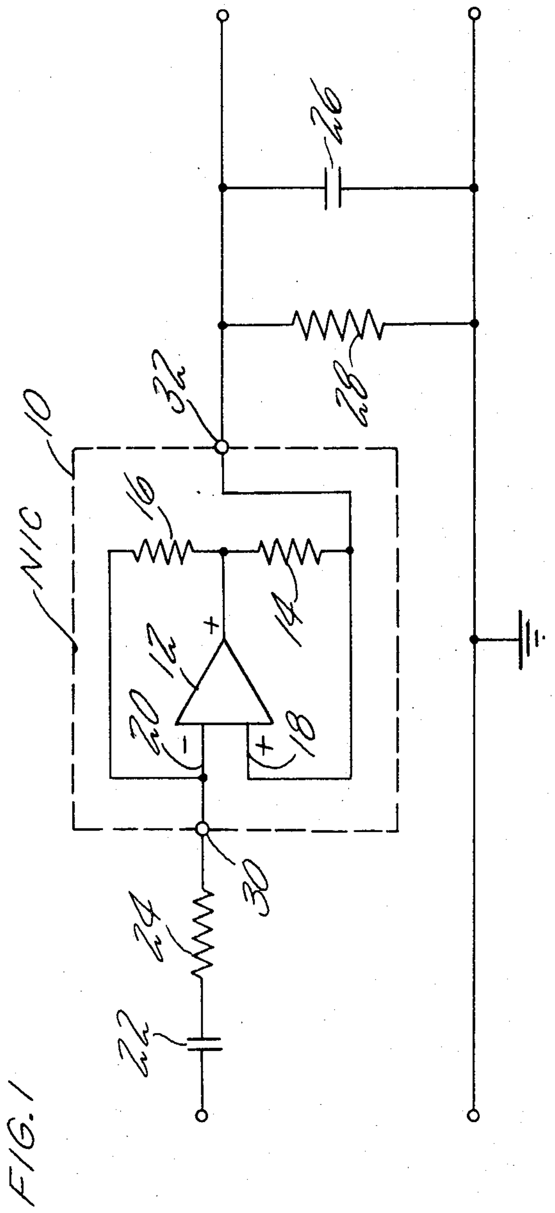
FIG. 1 is a schematic block diagram of a known active band pass filter network employing a negative impedance converter circuit.

Referring now to FIG. 1, a known type of active band pass filter network employs a negative impedance converter (NIC) circuit 10 which includes an operational amplifier 12 having feedback resistors 14, 16 respectively coupled to the noninverting input 18 and the inverting input 20 of the amplifier 12. The NIC circuit 10 is incorporated in a band pass filter by applying to the inverting input 20 a series circuit comprising a capacitor 22 and a resistor 24. The output of the device is taken from the non-inverting input 18 and comprises a parallel circuit of a capacitor 26 and a resistor 28. Devices of this type are extensively described in a handbook of the Burr-Brown Company, entitled Active RC Networks. It is also described in Electronics Magazine, Sept. 16, 1968, pages 105–108, in an article by Louis de Pian and Arnold Meltzer entitled "Active Filters: Part 4 Approaching The Ideal NIC." The NIC 10 has two ports 30, 32 and, basically, has the property that the impedance seen at either of its ports is the negative of the impedance connected to the other port. This "negative" action results from the characteristic that the NIC can invert the direction of current flow with respect to that which would normally occur in a passive network, without disturbing the relative polarity of the input and output voltages. The filter circuit of FIG. 1 can simply be considered to be an NIC stage having a high pass filter connected to its input port 30 and a low pass filter connected to its output port 32.

One of the advantageous characteristics of an NIC type band pass filter as shown in FIG. 1 is that the quality factor, or Q, of the circuit is adjustable by adjusting the gain of the NIC device 10. This adjustment in Q does not affect the center frequency of the device. Therefore, by increasing the gain, the Q of the overall filter can be increased, and decreasing the gain decreases the Q of the filter circuit.

In general the values of capacitors 22, 26 are the same, as is the resistance of the resistors 24, 28. These values are chosen such that will provide an RC time constant to give the desired basic frequency center frequency of the desired pass band. However, once the R/C product is chosen for the center frequency of the desired pass band, the values of the resistors and the capacitors, so long as the product is maintained, can vary over a wide range without affecting operation of the device. However, if the resistor value is chosen to be really small, then it is difficult for the NIC device 10 to drive the low pass output network; on the other hand if the resistors are too high, then the high pass input network render the impedance characteristics of the NIC device 10, including stray capacitance, to begin to play a significant roll in deteriorating operation of the device. The quality factor Q, of the band pass filter of FIG. 1 is determined solely by the gain of the NIC device 10, which in turn is determined solely by the ratio of the resistors 14, 16.

Figure 2:
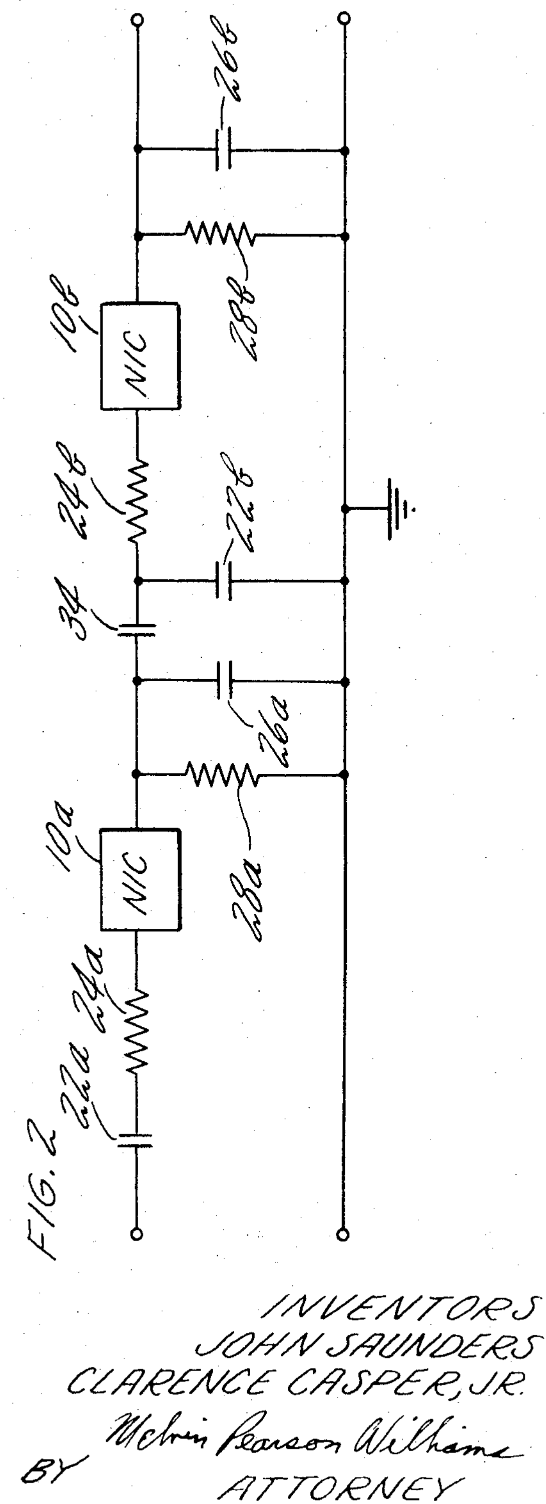
FIG. 2 is a schematic block diagram of a preferred embodiment of the present invention, in a mode employing a pi-type coupling network.

Referring now to FIG. 2, a pair of active filter networks, the first designated by subscripts *a* and the second by subscripts *b* of corresponding reference numerals in FIG. 1, are each of the type described with respect to FIG. 1 hereinbefore, and are connected in series by means of a coupling capacitor 34. In addition, the input capacitance **22*b* for the second stage is connected to ground. The values of the capacitors 26*a* and 22*b* may or may not be altered, as described more fully hereinafter. In accordance with the invention, in the embodiment of FIG. 2, the capacitance of the capacitor 34 is chosen to be sufficiently small so that it and the first stage of the filter represent a relatively large impedance and can be considered a current source with respect to the second stage of the filter. This may be achieved in either of two ways: either by making the capacitance of the capacitor 34 substantially smaller than an order of magnitude less than the basic capacitance of the capacitors 22, 26 (FIG. 1) at the particular design frequency, or by causing the capacitor 34 to have a capacitance approximating the same order of magnitude as the capacitance of the capacitors 22, 26 and adjusting the values of the capacitors 26*a*, 22*b* in a commensurate fashion. In the basic filter as shown in FIG. 1, both the high pass input filter (22, 24) and the low pass output filter (26, 28) have the same values of capacitors and resistors. These values are a function of the center frequency of the desired band pass characteristic. This capacitance is hereinafter referred to as $C_o$. When the value of the capacitor 34, hereinafter referred to as $C_m$, is taken to be roughly of the same order of magnitude as $C_o$, then the capacitors 26*a* and 22*b*** hereinafter referred to as $C_p$, and which are equal to each other, is as follows:

$$C_p \cong C_o - C_m C_o / C_m + C_o\,.$$

Employing this relationship between the capacitances, the band pass characteristic of the double tuned filter as shown in FIG. 2 is relatively flat, with a small peak to valley ratio, and with substantially equal peaks centered substantially equally about the center frequency of the filter. This may also be achieved by making the capacitance of the capacitor 34 less than one one-hundredth of $C_o$, but in such case, the gain of the NIC devices **10*a*, 10*b* must be increased to very nearly the limit of the device (a gain of two), at which point their stability becomes marginal. On the other hand, lower ratios of capacitance (such as with the capacitance of the capacitor 34 being one-fifth of $C_o$) may be chosen, but the gain of each of the NIC devices 10*a*, 10*b* must be reduced to such a point that additional amplification stages must be provided in series with the filter of FIG. 2 to derive useful output therefrom. The design of the basic NIC band pass filter of the type shown in FIG. 1** is known in the art, as is discussed in the aforementioned references. The utilization of the present invention, following design of a single stage, requires only adjustment of the capacitor values and the gains, as described hereinbefore.

Maximally flat response of the double tuned filter illustrated in FIG. 2 can be adjusted by adjusting the gains of the NIC circuits **10*a*, 10*b*, since this adjusts the Q of the individual circuits. Since it is desirous to maintain the two peaks on either side of the center frequency approximately the same to maintain symmetry in response, the gains of the two NIC circuits 10*a*, 10*b*** are normally maintained the same as each other. As is known, if the Q of the filter is increased, the attenuation rate of the skirts of the characteristic of the filter becomes steeper, and there is a tendency for a larger ratio of peak to valley within the pass band. With a lower Q, the band pass is not quite as wide and the skirts are not as steep, but the characteristic can be made more nearly flat across the pass band.

In the embodiment of FIG. 2, the combination of the coupling capacitor 34 and the output and input capacitor **26*a*, 26*b*** is in the form of a pi-type capacitive coupling network. An alternate form of the invention may utilize a T-type configuration in which case the output of the first filter stage becomes altered since its capacitance will be in series, with the leg of the T providing the necessary parallel capacitance for low pass operation, but the input to the second stage can revert to its original configuration as illustrated in FIG. 1. In other words, utilization of a T-network merely requires a change from altering the input to the second stage to altering the output of the first stage. Commensurate relationships between the values of the capacitances, in accordance with well known network theory, are readily derived to suit any implementation of the present invention. When the T configuration is used, the capacitor in the shunt capacitor in the leg of the T is 10 times greater than $C_o$, and the series capacitors would be slightly larger than $C_o$. Otherwise, the series capacitors could be equal to $C_o$ provided that the shunt capacitor in the leg of the T is substantially greater than 10 times more than $C_o$; this however is disadvantageous since larger capacitance requires a larger capacitive component which is difficult to implement in modern technology, requires more space and weight, etc.

Thus, although the invention has been shown and described with respect to a preferred embodiment thereof, it should be understood by those skilled in the art that the foregoing and various other changes and omissions in the form and detail thereof may be made therein without departing from the spirit and the scope of the invention.

Having thus described a typical embodiment of our invention, that which we claim as new and desire to secure by Letters Patent of the United States is:

1. A band pass active filter of the double tuned type, comprising:
   - first and second negative impedance converter circuits;
   - an R/C high pass filter connected to the input of said first negative impedance converter circuit;
   - an R/C low pass filter connected to the output of said second negative impedance converter circuit; and
   - a third R/C network, consisting only of series and shunt capacitance and resistance, connected between the output of said first negative impedance converter circuit and the input of said second negative impedance converter circuit, said network providing a low pass filter to the output of said first negative impedance converter circuit, a high pass filter network to the input of said second negative impedance converter circuit, and capacitive coupling between said negative impedance converter circuits.

2. The filter according to claim 1 wherein the shunt capacitance is at least two orders of magnitude greater than the series capacitance.

3. The filter according to claim 1 wherein the shunt capacitance is approximately one order of magnitude greater than the series capacitance.

4. The filter according to claim 3 wherein said third R/C network comprises a shunt resistor connected to the output of said first negative impedance converter circuit, a series resistor connected to the input of said second negative impedance converter circuit, and a pi-type capacitive coupling network connected between said shunt resistor and said series resistor.

5. The filter network according to claim 4 wherein the value of the shunt capacitors in said pi-type capacitive coupling network ($C_p$) is given by the following relationship:

$$C_p \cong C_o - C_m C_o / C_m + C_o$$

where $C_o$ equals the capacitance of the capacitor in the input high pass filter network and the output low pass filter network, and $C_m$ is the capacitance of the series, coupling capacitor in said pi-type capacitive coupling network.

* * * * *